(12) United States Patent
Kurokawa

(10) Patent No.: US 11,642,869 B2
(45) Date of Patent: May 9, 2023

(54) PHOSPHOR PROTECTION FILM, WAVELENGTH CONVERSION SHEET, AND LIGHT-EMITTING UNIT

(71) Applicant: TOPPAN PRINTING CO., LTD., Tokyo (JP)

(72) Inventor: Masato Kurokawa, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 463 days.

(21) Appl. No.: 16/839,489

(22) Filed: Apr. 3, 2020

(65) Prior Publication Data

US 2020/0230915 A1   Jul. 23, 2020

Related U.S. Application Data

(63) Continuation of application No. PCT/JP2018/036435, filed on Sep. 28, 2018.

(30) Foreign Application Priority Data

Oct. 5, 2017 (JP) .............................. JP2017-195017

(51) Int. Cl.
| | |
|---|---|
| *B32B 7/12* | (2006.01) |
| *B32B 7/02* | (2019.01) |
| *B32B 9/00* | (2006.01) |
| *F21S 2/00* | (2016.01) |
| *G02B 5/20* | (2006.01) |
| *H01L 33/50* | (2010.01) |

(52) U.S. Cl.
CPC ................. *B32B 7/12* (2013.01); *B32B 7/02* (2013.01); *B32B 9/00* (2013.01); *F21S 2/00* (2013.01); *G02B 5/20* (2013.01); *H01L 33/505* (2013.01); *B32B 2307/40* (2013.01); *B32B 2309/105* (2013.01)

(58) Field of Classification Search
CPC ........ B32B 7/12; B32B 2307/422; G02B 5/20
See application file for complete search history.

(56) References Cited

U.S. PATENT DOCUMENTS

2017/0157906 A1   6/2017   Nishikawa et al.

FOREIGN PATENT DOCUMENTS

| | | |
|---|---|---|
| CN | 106536197 A | 3/2017 |
| CN | 110945390 A | 3/2020 |
| JP | 2011-013567 A | 1/2011 |
| JP | 2016-141050 A | 8/2016 |
| JP | 2017-087668 A | 5/2017 |

(Continued)

OTHER PUBLICATIONS

Notification of Reasons for Rejection issued in corresponding Japanese Patent Application No. 2019-546683 dated May 31, 2022.

(Continued)

*Primary Examiner* — Elizabeth E Mulvaney
(74) *Attorney, Agent, or Firm* — Foley & Lardner LLP

(57) ABSTRACT

A phosphor protection film that includes two films that are bonded to each other via an adhesive layer. One of the two films is a film including an inorganic film layer. In the phosphor protection film, when the film including the inorganic film layer of the two films is a barrier film and the other film of the two films is a support film, the support film has a thickness occupying 72% or more of the total thickness of the phosphor protection film.

7 Claims, 5 Drawing Sheets

(56) References Cited

FOREIGN PATENT DOCUMENTS

| JP | 2017-100350 A | 6/2017 |
| JP | 2018-091967 | 6/2018 |
| WO | WO-2017/038141 A1 | 3/2017 |
| WO | WO 2017/086319 * | 5/2017 |
| WO | WO-2017/126609 A1 | 7/2017 |

OTHER PUBLICATIONS

International Searching Authority, "International Search Report," issued in connection with International Patent Application No. PCT/JP2018/036435, dated Jan. 8, 2019.

International Searching Authority, "Written Opinion," issued in connection with International Patent Application No. PCT/JP2018/036435, dated Jan. 8, 2019.

Office Action Dec. 28, 2021 issued in a corresponding Chinese Patent Application No. 201880063996.7, (20 pages).

* cited by examiner

FIG.5

| | DEGREE OF WRINKLINGS | PHOTOGRAPH (LONGITUDINAL DIRECTION CORRESPONDS TO MD.) |
|---|---|---|
| EXAMPLE 5 | A | |
| EXAMPLE 6 | B | |
| COMPARATIVE EXAMPLE 1 | C | |

PHOSPHOR PROTECTION FILM, WAVELENGTH CONVERSION SHEET, AND LIGHT-EMITTING UNIT

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/036435, filed on Sep. 28, 2018, which is based upon and claims the benefit of priority to Japanese Patent Application No. 2017-195017, filed on Oct. 5, 2017, the disclosures of which are all incorporated herein by reference in their entireties.

TECHNICAL FIELD

The present invention relates to a phosphor protection film, a wavelength conversion sheet with the phosphor protection film, and a light-emitting unit using the wavelength conversion sheet with the phosphor protection film.

BACKGROUND ART

As backlight units of liquid crystal displays, or light-emitting units, such as electroluminescent light-emitting units, there have been provided those units that ensure a laser beam generated in a LED to be incident on a phosphor to change the wavelength of the laser beam. Since change of wavelength leads to change of color, light of various wavelengths, i.e., light that has been changed to various colors, can be used for displaying a color image on a screen.

Phosphors, when brought into contact with oxygen, water vapor or the like and left for a long time, may suffer from performance deterioration. To prevent such performance deterioration, it has been a practice to overlay a protective film on a phosphor layer containing phosphors or to sandwich a phosphor layer between protective films. As protective films, there are known, for example, those that are obtained by vacuum-depositing an inorganic film layer on a resin film. The inorganic film layer deposited on the resin film can block permeation of oxygen or water vapor (see PTL 1).

However, this type of protective films may suffer from wrinkling mainly due to heat and tension applied to the resin films during the process of producing the protective films. When a phosphor layer is laminated on a protective film in which wrinkles have been formed, the phosphor layer is unlikely to have a sufficiently uniform thickness across the layer and may develop defects, such as uneven emission from phosphors.

PTL 2 discloses preparing two barrier films in each of which an inorganic film layer as mentioned above is formed, laminating one barrier film on top of the other, and further laminating a film (support film) having a predetermined thickness on the laminate of the barrier films, thereby preventing wrinkling. Specifically, even when wrinkles are formed in a laminate film in which two barrier films are laminated with each other, use of a support film having strength for remedying the wrinkles can smooth out the wrinkles. More specifically, the support film is bonded to the laminate film with the wrinkles being sufficiently smoothed out to retain the state of being smoothed out. In other words, by laminating a support film onto the laminate film mentioned above, a protective film with sufficiently reduced thermal wrinkles can be obtained.

[Citation List] [Patent Literature] [PTL 1] JP 2011-13567 A; [PTL 2] WO2017/126609 A1

SUMMARY OF THE INVENTION

Technical Problem

In the phosphor protection film described in PTL 2, two barrier films and a support film are used and these three films are adhered to each other. This raises an issue of increasing the number of films to be used and involving two adhesion processes.

In light of such circumstances, the present invention aims to provide a phosphor protection film that is formed by using two films and is capable of reducing or even preventing wrinkling. In addition, the present invention aims to provide a wavelength conversion sheet and a light-emitting unit, using the phosphor protection film.

Solution to Problem

To achieve the above object, the present invention provides a phosphor protection film including two films that are bonded to each other via an adhesive layer, one of the two films being a film including an inorganic film layer. In the phosphor protection film, when the film including the inorganic film layer of the two films is referred to as a barrier film and the other film of the two films is referred to as a support film, the support film has a thickness occupying 72% or more of a total thickness of the phosphor protection film.

In the phosphor protection film, the barrier film may have a thickness occupying 23% or less of the total thickness of the phosphor protection film.

In the phosphor protection film, the barrier film may include a barrier film substrate having a thickness in a range of 9 μm to 25 μm.

In the phosphor protection film, the barrier film may be provided with the inorganic film layer and a gas barrier covering layer on the barrier film substrate.

In the phosphor protection film, the support film may be provided with a functional layer on a surface facing away from the adhesive layer, the functional layer exerting at least one function selected from a group consisting of an anti-interference fringe function, an anti-reflection function, a light diffusion function, an antistatic function and an anti-scratch function.

The phosphor protection film may have a wrinkle coefficient α that is more negative than −0.2, the wrinkle coefficient α being defined by the following Formula (1):

$$\alpha = \Delta L / \{(T_b \times 100)/T\} \quad (1)$$

where ΔL indicates a heat shrinkage (%) in TD after heating at 150° C. for 30 minutes, $T_b$ indicates a thickness (μm) of a barrier film, and T indicates a total thickness (μm) of the phosphor protection film.

The present invention also provides a wavelength conversion sheet including two phosphor protection films of the present invention described above, and a phosphor layer sandwiched between the two phosphor protection films. In the wavelength conversion sheet, the two phosphor protection films both include the support films that are located closer to respective external surfaces of the wavelength conversion sheet than the barrier films are.

The present invention also provides a light-emitting unit including the wavelength conversion sheet of the present invention described above, a light source and a light guide plate. In the light-emitting unit, the wavelength conversion sheet, the light source and the light guide plate are disposed such that light emitted from the light source passes through the light guide plate and is incident on one surface of the wavelength conversion sheet.

Advantageous Effects of the Invention

As will be understood from the examples described later, even when the phosphor protection film is constituted by two films, i.e., a barrier film and a support film, a reduced number of wrinkles ore even no wrinkles are formed in the phosphor protection film if the support film has a thickness occupying 72% or more of the total thickness of the phosphor protection film. When a phosphor layer is laminated on the phosphor protection film of the present invention, the phosphor layer will have a sufficiently uniform thickness across the phosphor layer, so that light without unevenness can be emitted.

BRIEF DESCRIPTION OF THE DRAWINGS

FIGS. 1A and 1B are a set of diagrams in which FIG. 1A is a schematic cross-sectional view illustrating a specific example of a phosphor protection film according to the present invention, and FIG. 1B is a cross-sectional view illustrating another specific example.

FIG. 5 shows photographs indicating the degree of wrinkling on the surfaces of phosphor protection films obtained in the examples and the comparative example.

DETAILED DESCRIPTION

Figure 1A:
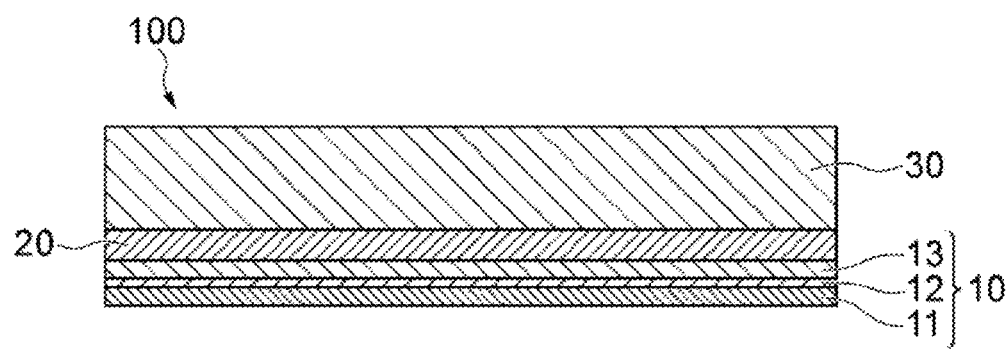

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Figure 1B:
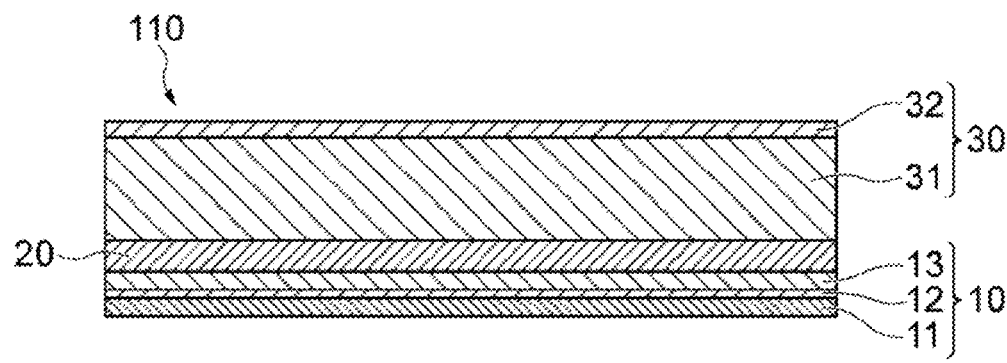

The present invention will be described referring to the drawings. FIGS. 1A and 1B are a set of diagrams in which FIG. 1A is a schematic cross-sectional view illustrating a specific example of a phosphor protection film according to the present invention, and FIG. 1B is a schematic cross-sectional view illustrating another specific example.

As can be seen from FIG. 1A, a phosphor protection film 100 of the present embodiment is constituted by bonding a barrier film 10 and a support film 30 together via an adhesive layer 20.

The barrier film 10 is required to include at least an inorganic film layer 12. The barrier film 10 may have the inorganic film layer 12 on a barrier film substrate 11. In addition to this, the barrier film 10 may desirably have a gas barrier covering layer 13 on the inorganic film layer 12. In the phosphor protection film 100, the barrier film 10 is formed by sequentially laminating the inorganic film layer 12 and the gas barrier covering layer 13 on the barrier film substrate 11.

In the phosphor protection film 100, the support film 30 is formed of a resin film having a single-layer structure. Alternatively, a resin film may be used as a support film substrate 31 and a coating material may be applied to the support film substrate 31 to obtain a support film 30. Alternatively, a deposited film may be laminated on a support film substrate 31 for use as a support film 30. A coating film of a coating material, or a deposited film may impart an optical or mechanical function. FIG. 1B shows an example of laminating such a coating film or a deposited film as a functional layer 32.

In either of the cases, the support film 30 is required to have a thickness that is 72% or more of the thickness (total thickness) of the phosphor protection film 100 or 110. If the thickness of the support film 30 is less than this, wrinkles cannot be prevented from being formed. The barrier film 10 may desirably have a thickness that is 23% or less of the thickness (total thickness) of the phosphor protection film 100 or 110. It should be noted that the thickness (total thickness) of the phosphor protection film 100 or 110 may be in the range of 50 μm to 300 μm.

The barrier film substrate 11 may preferably be, but is not limited to, a substrate having total light transmittance of 85% or more. For example, a polyethylene terephthalate film, a polyethylene naphthalate film, or the like may be used as a substrate having high transparency and high heat resistance. For example, the substrate may have a thickness in the range of 9 μm to 50 μm, preferably 12 μm to 30 μm, and more preferably 12 μm to 25 μm. When the thickness of the barrier film substrate 11 is 9 μm or more, the strength of the barrier film substrate 11 can be sufficiently ensured. When the thickness of the barrier film substrate 11 is 50 μm or less, a long roll can be efficiently and economically produced.

For example, materials that may be used for the inorganic film layer 12 include, but are not limited to, aluminum oxide, silicon oxide, magnesium oxide, and mixtures thereof. Of these materials, aluminum oxide or silicon oxide may be preferably used from the perspective of barrier properties and productivity.

The inorganic film layer 12 may preferably have a thickness (film thickness) in the range of 5 nm to 500 nm, and more preferably 10 nm to 100 nm. When the thickness is 5 nm or more, a uniform film may be easily formed, and the film may sufficiently serve as a gas barrier member. When the thickness is 500 nm or less, sufficient flexibility may be maintained due to the film being thin, and the occurrence of cracks in the film may be more reliably prevented, which would otherwise occur due to external factors, such as bending or stretching, after the film is formed.

The gas barrier covering layer 13 is provided to prevent various types of secondary damage that would occur during the post processing and to impart higher barrier properties to the laminate. From the perspective of obtaining good barrier properties, the gas barrier covering layer 13 may preferably contain at least one component selected from the group consisting of a hydroxyl group-containing polymer compound, metal alkoxide, metal alkoxide hydrolysate and metal alkoxide polymer. The gas barrier covering layer 13 may further contain a silane coupling agent.

Specifically, for example, the hydroxyl group-containing polymer compound may be a water-soluble polymer, such as polyvinyl alcohol, polyvinyl pyrrolidone or starch. Particularly, the best barrier properties may be obtained when polyvinyl alcohol is used.

The metal alkoxide is a compound expressed by a general formula: $M(OR)_n$ (where M is a metal atom such as Si, Ti, Al or Zr, R is an alkyl group such as $-CH_3$ or $-C_2H_5$, and n is an integer corresponding to a valence of M). Specifically, such a compound may be tetraethoxysilane [$Si(OC_2H_5)_4$], triisopropoxy aluminum [$Al(O\text{-}iso\text{-}C_3H_7)_3$], or the like. Tetraethoxysilane or triisopropoxy aluminum may be preferred because they are relatively stable in an aqueous solvent after being hydrolyzed. Examples of a hydrolysate or a polymer of the metal alkoxide may include silicic acid ($Si(OH)_4$) that is a hydrolysate or a polymer of tetraethoxysilane, and aluminum hydroxide ($Al(OH)_3$) that is a hydrolysate or a polymer of tripropoxy aluminum.

The gas barrier covering layer 13 may preferably have a thickness (film thickness) in the range of 50 nm to 1,000 nm, and more preferably 100 nm to 500 nm. When the thickness is 50 nm or more, even better gas barrier properties may be obtained, and when the thickness is 1,000 nm or less, sufficient flexibility may be retained due to the film being thin.

The support film 30 may preferably be, but is not limited to, a resin film having total light transmittance of 85% or more. For example, as a resin film having high transparency and good heat resistance, a polyethylene terephthalate film, a polyethylene naphthalate film, or the like may be used. The support film 30 is required to have a thickness that is 72% or more of the total thickness of the phosphor protection film 100 or 110. Therefore, the thickness of the support film 30 should be determined considering the thickness of the barrier film 10 or the thickness of the adhesive layer 20. The thickness of the support film 30 may, for example, be in the range of 25 µm to 250 µm. Preferably, the thickness of the support film 30 may be in the range of 25 µm to 240 µm, more preferably 40 µm to 210 µm, and even more preferably 55 µm to 200 µm. When the thickness of the support film 30 occupies 72% or more of the total thickness of the phosphor protection film 100 or 110, a strength for obtaining an effect of improving wrinkles of the phosphor protection film 100 or 110 may be sufficiently ensured. When the thickness of the support film 30 is 250 µm or less, the total thickness of the phosphor protection film 100 or 110 can be easily prevented from becoming excessively large.

In the case where a film in which a functional layer 32 is laminated on a support film substrate 31 is used as a support film 30, the resin film mentioned above, i.e., a polyethylene terephthalate film or a polyethylene naphthalate film, may be used as the support film substrate 31.

For example, the functional layer 32 may be a coating film comprising a binder resin and microparticles. The microparticles may be embedded in the binder resin so as to be partially exposed from the surface of the functional layer 32, so that fine asperities may be formed on the surface of the functional layer 32. By providing the functional layers 32 on the respective surfaces of the phosphor protection films (the surfaces of the support films 30), i.e., the surfaces of a wavelength conversion sheet, the occurrence of interference fringes, such as Newton's rings, may be sufficiently prevented. Also, provision of the functional layer 32 may exert a light diffusion function of scattering incident light, exerting an anti-reflection function.

The binder resin may be, but is not limited to, a resin having good optical transparency. More specifically, for example, the material for the binder resin may be a thermoplastic resin, thermosetting resin or ionizing radiation-curable resin, including a polyester resin, acrylic resin, acrylic urethane resin, polyester acrylate resin, polyurethane acrylate resin, urethane resin, epoxy resin, polycarbonate resin, polyamide resin, polyimide resin, melamine resin and phenolic resin. Of these resins, an acrylic resin may be preferably used because of having good light resistance and optical properties. These resins may be used singly or in combination of two or more. Furthermore, use of a thermosetting resin, an ionizing radiation-curable resin or the like may allow the functional layer 32 to exert an anti-scratch function.

Examples of the microparticles may include, but are not limited to, inorganic microparticles such as of silica, clay, talc, calcium carbonate, calcium sulfate, barium sulfate, titanium oxide or alumina, and organic microparticles such as of a styrene resin, urethane resin, silicone resin, acrylic resin or the like. These resins may be used singly or in combination of two or more.

The microparticles may preferably have a mean particle size in the range of 0.1 µm to 30 µm, and more preferably 0.5 µm to 10 µm. When the mean particle size of the microparticles is 0.1 µm or more, a good anti-interference fringe function may be obtained, and when it is 30 µm or less, transparency may be improved even more. The content of the microparticles in the functional layer 32 may preferably be in the range of 0.5 mass % to 30 mass %, and more preferably 3 mass % to 10 mass % relative to the total mass of the functional layer 32. When the content of the microparticles is 0.5 mass % or more, light diffusion function and the effect of preventing the occurrence of interference fringes may be improved even more. When the content of the microparticles is 30 mass % or less, brightness may be sufficiently prevented from being lowered.

An adhesive or a tackifier forming the adhesive layer 20 may be an acrylic adhesive, epoxy adhesive, urethane adhesive or the like. The adhesive may preferably contain an epoxy resin. The adhesive containing an epoxy resin may improve adhesion between the barrier film 10 and the support film 30. The tackifier may be an acrylic tackifier, polyvinyl ether tackifier, urethane tackifier, silicone tackifier, starch paste tackifier or the like. The adhesive layer 20 may preferably have a thickness in the range of 0.5 µm to 50 µm, more preferably 1 µm to 20 µm, and even more preferably 2 µm to 6 µm. When the thickness of the adhesive layer 20 is 0.5 µm or more, adhesion between the barrier film 10 and the support film 30 may be easily obtained. When the thickness of the adhesive layer 20 is 50 µm or less, better gas barrier properties may be easily obtained.

The adhesive layer 20 may have oxygen permeability, for example, of 1,000 $cm^3/(m^2 \cdot day \cdot atm)$ or less in the thickness direction when the thickness is 5 µm. The oxygen permeability may preferably be 500 $cm^3/(m^2 \cdot day \cdot atm)$ or less, more preferably 100 $cm^3/(m^2 \cdot day \cdot atm)$ or less, even more preferably 50 cm³/(m²·day·atm) or less, and most preferably 10 cm³/(m²·day·atm) or less. When the oxygen permeability of the adhesive layer 20 is 1,000 cm³/(m²·day·atm) or less, a phosphor protection film 100 or 110 which can minimize the occurrence of dark spots may be obtained, even if the inorganic film layer 12 or the gas barrier covering layer 13 has defects. The oxygen permeability may have, but is not limited to, a lower limit, e.g., of 0.1 cm³/(m²·day·atm).

The phosphor protection film 100 or 110 may preferably have a wrinkle coefficient α of more negative than −0.2. The wrinkle coefficient α is defined by the following Formula (1).

$$\alpha = \Delta L / \{(T_b \times 100)/T\} \quad (1)$$

In the formula, $\Delta L$ indicates the heat shrinkage (%) in TD after heating at 150° C. for 30 minutes, $T_b$ indicates the thickness (μm) of a barrier film, and T indicates the total thickness (μm) of a phosphor protection film.

TD (transverse direction) refers to a direction perpendicular to MD (machine direction). MD is a direction (longitudinal direction) in which the phosphor protection film is taken up in a roll. If a phosphor protection film that has not been taken up in a roll is used, TD and MD can be determined such as by measuring the stretch direction (by measuring the orientation angle or the plane orientation coefficient) or measuring the difference in stretch coefficient between directions. ΔL can be measured by using a sample of the phosphor protection film 100 or 110 cut to a size of 100 mm in MD by 100 mm in TD. Specifically, this sample is left to stand, without being tensioned, on a metal plate with the barrier film side down, and heated in an oven at 150° C. for 30 minutes for measurement of ΔL. ΔL can be calculated from the following Formula (2).

$$\Delta L = \{(\text{Length in } TD \text{ before heating} - \text{Length in } TD \text{ after heating})/\text{Length in } TD \text{ before heating}\} \times 100 \quad (2)$$

In the phosphor protection film 100 or 110, wrinkles are likely to occur in MD. However, these wrinkles in MD can be reduced due to the wrinkle coefficient α being more negative than −0.2. When ΔL has a negative value, the phosphor protection film 100 or 110 stretches in TD when heated at 150° C. for 30 minutes. The smaller the value is, the more the stretch increases. The wrinkle coefficient α can be calculated by dividing ΔL by the ratio of the thickness of the barrier film to the total thickness of the phosphor protection film. When the calculated value is more negative than 0.2, the phosphor protection film 100 or 110 should have enough room for stretch in TD by being heated, resultantly even more easily reducing wrinkles in MD. The wrinkle coefficient α may be lowered by increasing the thickness of the support film 30, increasing the ratio of the thickness of the support film 30 to the total thickness of the phosphor protection film 100 or 110, reducing the heating temperature when producing the barrier film, or the like.

The wrinkle coefficient α is preferably in the range of −1.00 to −0.20, more preferably −0.60 to −0.22, even more preferably −0.50 to −0.23, and most preferably −0.35 to −0.25. When the wrinkle coefficient α is −0.22 or less, wrinkles can be more sufficiently reduced, and when it is −1.00 or more, the occurrence of wrinkles due to loosening can be minimized and, at the same time, water vapor barrier properties can be improved more.

The phosphor protection film 100 or 110 can be produced through the following process by using a roll-to-roll method. Specifically, first, a roll of a barrier film substrate 11 is prepared. While the barrier film substrate 11 is fed out from the roll, an inorganic film layer 12 is laminated thereon, or an inorganic film layer 12 and a gas barrier covering layer 13 are sequentially laminated thereon to produce a long barrier film 10. This barrier film 10 is taken up in a roll. Then, while the barrier film 10 is fed out from the roll, an adhesive is applied onto the gas barrier covering layer 13 to form an adhesive layer 20. Then, a support film 30 is overlaid on the adhesive layer 20, which is followed by pressing to thereby produce a phosphor protection film 100 or 110.

In preparation for forming an inorganic film layer 12 on the barrier film substrate 11, an anchor coat layer may be provided on the barrier film substrate 11 to enhance adhesion between the barrier film substrate 11 and the inorganic film layer 12. The anchor coat layer 12 may have barrier properties to prevent permeation of moisture or oxygen. The anchor coat layer may be made of a resin which is selected, for example, from polyester resins, isocyanate resins, urethane resins, acrylic resins, polyvinyl alcohol resins, ethylene vinyl alcohol resins, vinyl-modified resins, epoxy resins, oxazoline group-containing resins, modified styrene resins, modified silicone resins, alkyl titanate, and the like. The anchor coat layer may be formed of the resins mentioned above used singly or in combination of two or more as a composite resin. The inorganic film layer 12 may be formed using a vapor deposition method. The vapor deposition method may be vacuum vapor deposition, sputtering or ion plating. In the process of forming an inorganic film layer 12, tension or heat may be unavoidably applied to the barrier film substrate 11. Due to the tension or heat, wrinkles may occur in the barrier film substrate 11.

Next, an aqueous solution or a water-alcohol mixed solution may be applied onto the surface of the inorganic film layer 12. The aqueous solution or water-alcohol mixed solution may contain, for example, at least one component selected from the group consisting of metal alkoxide, metal alkoxide hydrolysate and metal alkoxide polymer, hydroxyl group-containing polymer compound and, as necessary, a silane coupling agent. The material is then heated and dried at, for example, 80° C. to 250° C., thereby forming a gas barrier covering layer 13. In the process of forming the gas barrier covering layer 13 as well, tension may be unavoidably applied to the barrier film substrate 11. The tension or heating and drying may be the cause of wrinkles in the barrier film substrate 11.

The temperature during the heating and drying in the process of forming the gas barrier covering layer 13 may preferably be 210° C. or less, and more preferably 180° C. or less. When the temperature is 210° C. or less, the wrinkle coefficient α can be reduced more. The temperature during the heating and drying mentioned above may preferably be 120° C. or more, and more preferably 150° C. or more. When the temperature is 120° C. or more, water vapor barrier properties can be improved more.

Figure 2:
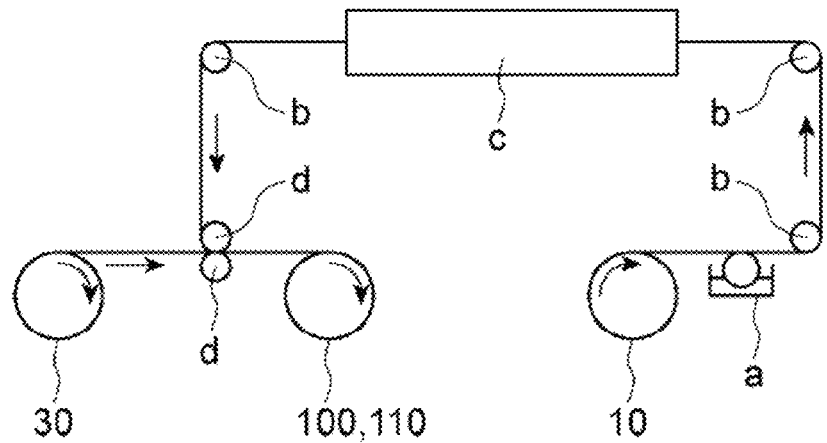
FIG. 2 is a schematic diagram illustrating an example of a laminating device.

Next, the barrier film 10 is adhered to a support film 30. These films may be adhered to each other through a roll-to-roll method using a laminating device as shown in FIG. 2. Specifically, the barrier film 10 is fed out from the roll to apply an adhesive (or tackifier) onto the gas barrier covering layer 13 of the barrier film 10 by using an adhesive coater a to thereby form an adhesive layer 20. Next, the barrier film 10 on which the adhesive layer 20 has been formed is guided into an oven c via guide rolls b to dry the adhesive layer 20. The temperature in the oven c may be changed stepwise by using a plurality of units, each of which may be set to a temperature in the range of 25° C. to 200° C. After drying the adhesive layer 20, the barrier film 10 is conveyed and guided, via a guide roll b, to a nip roll d. In parallel with this, the support film 30 is fed out from the roll and conveyed to a nip roll d. Thus, between the nip rolls d,d, the support film 30 is pressed against and bonded to the surface of the barrier film 10 onto which the adhesive has been applied. The laminating pressure between the nip rolls d,d may, for example, be in the range of 0.05 MPa to 0.2 MPa. Then, the phosphor protection film 100 or 110 resulting from the bonding is taken up in a roll. According to this method, a phosphor protection film 100 or 110 with sufficiently reduced thermal wrinkles can be obtained by laminating a support film 30 to a barrier film 10.

In the process of bonding the support film 30 to the barrier film 10 via the adhesive layer 20, the support film 30 may desirably be bonded to the barrier film 10 that is in a state in which wrinkles are smoothed out such as by being tensed in MD (feed direction) of the barrier film 10 (in a state in which no wrinkles are present). Thus, the barrier film 10 in a state in which wrinkles have been eliminated is held by the support film 30. In this way, a phosphor protection film 100 or 110 having fewer wrinkles can be obtained. It should be noted that the support film 30 may be bonded to a barrier film 10 in which the wrinkles have not been intentionally smoothed out. In this case as well, the wrinkles of the barrier film 10 are eliminated when the barrier film 10 is pressed between the nip rolls d, d. Thus, a phosphor protection film 100 or 110 without wrinkles can be obtained. If the thickness of the support film is less than 72% of the total thickness of the phosphor protection film, wrinkles are not necessarily prevented from occurring in the obtained phosphor protection film even when the barrier film and the support film are bonded to each other with the wrinkles of the barrier film being smoothed out.

Figure 3:
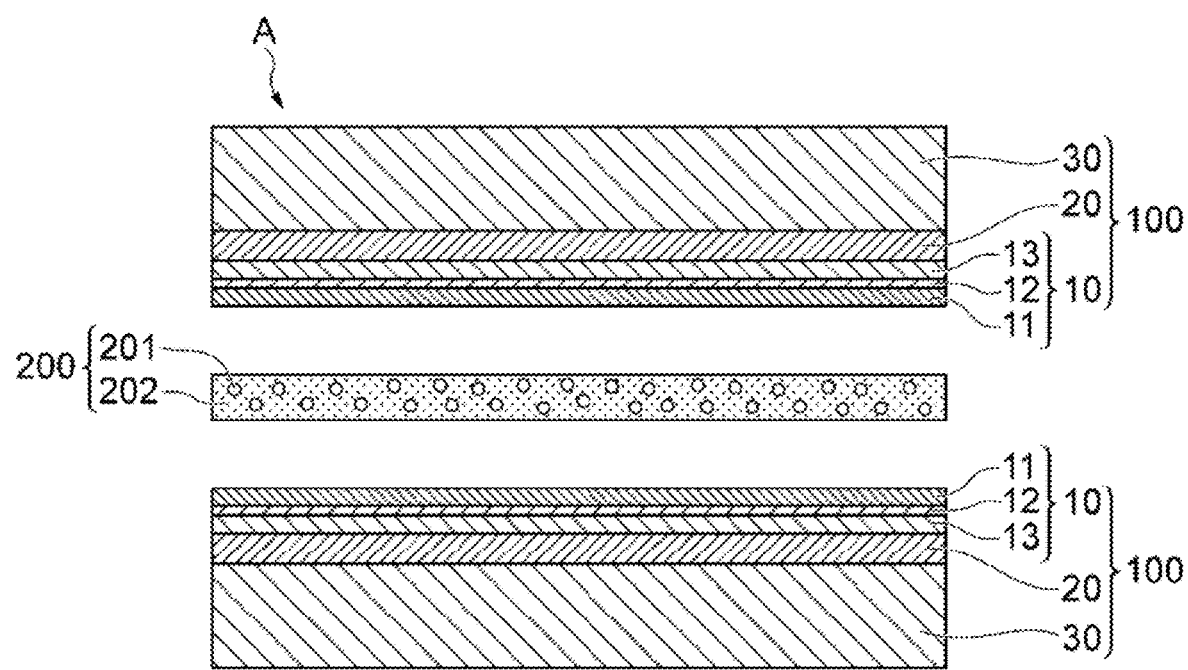
FIG. 3 is a schematic exploded cross-sectional view illustrating a specific example of a wavelength conversion sheet.
Figure 4:
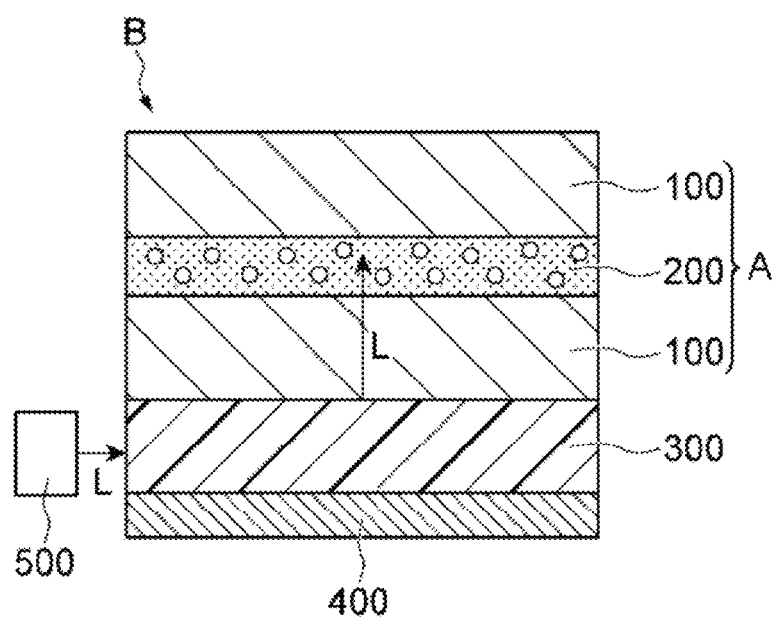
FIG. 4 is a schematic cross-sectional view illustrating a specific example of a light-emitting unit.

The phosphor protection film 100 or 110 can be used as a part of a wavelength conversion sheet. The wavelength conversion sheet produced in this way can be used as part of a backlight unit of a liquid crystal display or as a part of a light-emitting unit, such as an electroluminescent light-emitting unit. FIG. 3 is a schematic exploded cross-sectional view illustrating a specific example of a wavelength conversion sheet. FIG. 4 is a schematic cross-sectional view illustrating a specific example of a light-emitting unit.

As shown in FIG. 3, a wavelength conversion sheet A includes a phosphor layer 200 and phosphor protection films 100, 100 which are provided to respective surfaces of the phosphor layer 200. The wavelength conversion sheet A has a structure in which the phosphor layer 200 is wrapped (i.e., sealed) between the pair of phosphor protection films 100, 100. The phosphor protection films 100 may be phosphor protection films 110.

The phosphor layer 200 is a film having a thickness of several tens to several hundreds of μm and containing, as shown in FIG. 3, a sealing resin 202 and phosphors 201. In the sealing resin 202, the phosphors 201 are sealed, with one or more kinds of phosphors being mixed. When laminating the phosphor layer 200 and the pair of phosphor protection films 100, 100, the sealing resin 202 serves to join the pair of phosphor protection films 100, 100 and fill a gap therebetween. The phosphor layer 200 may be formed of two or more phosphor layers laminated with each other, with only one kind of phosphors 201 being sealed therein. For the two or more kinds of phosphors 201 used for the one or more phosphor layers, those which have the same excitation wavelength are selected. The excitation wavelength is selected based on the wavelength of light emitted from a light source. The fluorescent color is different between the two or more kinds of phosphors 201. When two kinds of phosphors 201 are used, their fluorescent colors may preferably be red and green. The fluorescence wavelengths and the wavelength of light emitted from the light source are selected based on the spectral characteristics of the color filter. The fluorescence peak wavelength is, for example, 610 nm for red, and 550 nm for green.

For example, the sealing resin 202 may be a thermoplastic resin, a thermosetting resin, an ultraviolet-curing resin, or the like. These resins may be used singly or in combination of two or more.

For example, the thermoplastic resin may be a cellulose derivative, such as acetyl cellulose, nitrocellulose, acetyl butyl cellulose, ethyl cellulose or methyl cellulose; a vinyl-based resin, such as vinyl acetate or a copolymer thereof, vinyl chloride or a copolymer thereof, or vinylidene chloride or a copolymer thereof; an acetal resin, such as polyvinyl formal or polyvinyl butyral; an acryl-based resin, such as an acrylic resin or a copolymer thereof, or a methacrylic resin or a copolymer thereof; a polystyrene resin; a polyamide resin; a linear polyester resin; a fluororesin; a polycarbonate resin; or the like.

The thermosetting resin may be a phenol resin, urea melamine resin, polyester resin, silicone resin or the like.

The ultraviolet-curing resin may be a photopolymerizable prepolymer, such as epoxy acrylate, urethane acrylate or polyester acrylate. Such a photopolymerizable prepolymer can be used as a main component, and a monofunctional or multifunctional monomer can be used as a diluent.

The phosphors 201 may preferably be quantum dots. For example, the quantum dots may be those which have cores as light-emitting parts which are respectively covered with shells as protective films. For example, the cores may be made of cadmium selenate (CdSe) or the like, and the shells may be made of zinc sulfide (ZnS) or the like. The quantum efficiency may be improved due to the surface defects of the CdSe particles being covered with ZnS having a large bandgap. The phosphors 201 may have cores which are each doubly covered with a first shell and a second shell. In this case, CdSe may be used for the cores, zinc selenide (ZnSe) may be used for the first shell and ZnS may be used for the second shell. As phosphors 201 other than quantum dots, YAG:Ce or the like may be used.

The phosphors 201 may preferably have a mean particle size in the range of 1 nm to 20 nm. The phosphor layer 200 may preferably have a thickness in the range of 1 μm to 500 μm. The content of the phosphors 201 in the phosphor layer 200 may preferably be 1 mass % to 20 mass %, and more preferably 3 mass % to 10 mass %, relative to the total mass of the phosphor layer 200.

As mentioned above, the wavelength conversion sheet A can be used as a part of a light-emitting unit B.

As shown in FIG. 4, the light-emitting unit B includes a light source 500, a light guide plate 300 and the wavelength conversion sheet A. Specifically, the light guide plate 300 and a reflective plate 400 are arranged in this order on the surface of one phosphor protection film 100 of the light-emitting unit B, and the light source 500 is arranged in a lateral direction of the light guide plate 300. For example, the light guide plate 300 may have a thickness in the range of 100 μm to 1000 μm.

The light guide plate 300 and the reflective plate 400 are ensured to efficiently reflect light emitted from the light source 500 and guide the light to the phosphor layer 200. As the light guide plate 300, for example, an acrylic film, a polycarbonate film, a cycloolefin film or the like may be used. As the light source 500, for example, there may be provided a plurality of blue light-emitting diode elements.

The light-emitting diode elements may be purple light-emitting diodes or light-emitting diodes having an even shorter wavelength. The light emitted from the light source 500 is incident on the light guide plate 300 and then enters the phosphor layer 200 as a result of reflection, diffraction, and the like.

The light that has passed through the phosphor layer 200 becomes white light because the light that has not passed through the phosphor layer 200 is mixed with yellow light generated in the phosphor layer 200. Since the performance of the phosphor layer 200 may be deteriorated due to contact with oxygen, water vapor or the like over a long period of time, the phosphor layer 200 is protected, as shown in FIG. 4, by the pair of phosphor protection films 100, 100.

EXAMPLES

The present invention will be more specifically described below based on examples and a comparative example; however, the present invention should not be limited to the following examples.

Example 1

A barrier film 10 was prepared as described below using a roll-to-roll method. First, silicon oxide was provided as an inorganic film layer 12 by vacuum vapor deposition on one surface of a polyethylene terephthalate (PET) film as a barrier film substrate 11, and a gas barrier covering layer 13 was formed on the inorganic film layer 12. The gas barrier covering layer 13 was formed using a wet coating method by applying a coating liquid containing tetraethoxysilane and polyvinyl alcohol, followed by heating and drying at 180° C. for 40 seconds. Thus, a roll of a barrier film 10 provided with the inorganic film layer 12 and the gas barrier covering layer 13 on one surface of the substrate 11 was obtained. The barrier film 10, the barrier film substrate 11, the inorganic film layer 12 and the gas barrier covering layer 13 respectively had thicknesses of 23.5 μm, 23 μm, 30 nm and 0.5 μm.

As a support film 30, a PET film having a thickness of 75 μm was used. The barrier film 10 was fed from the roll using the laminating device shown in FIG. 2, and an adhesive was applied onto the gas barrier covering layer 13 to form an adhesive layer 20 which was then heated and dried at 90° C. for 30 seconds. Then, the support film 30 was laid over the adhesive layer 20 and the resultant laminate was pressed between the nip rolls d, d at a laminating pressure of 0.5 MPa, thereby producing a phosphor protection film 100. The laminate was pressed in a state in which wrinkles of the barrier film 10 were smoothed out by applying tension in MD.

An acrylic tackifier was used as the adhesive. The adhesive layer 20 had a thickness of 5 μm. Since the barrier film 10 and the support film 30 respectively had thicknesses of 23.5 μm and 75 μm, the obtained phosphor protection film 100 had a thickness (total thickness) of 103.5 μm. The ratio of the thickness of the support film 30 was 72% relative to the total thickness of the phosphor protection film 100. Similarly, the ratio of the barrier film 10 was 23%, and the ratio of the adhesive layer 20 was 5%.

Example 2

A phosphor protection film 100 was produced as in Example 1 except that the barrier film substrate 11, the barrier film 10 and the support film 30 respectively had thicknesses of 12 μm, 12.5 μm and 75 μm. The adhesive layer 20 had a thickness of 5 μm and the phosphor protection film 100 had a thickness (total thickness) of 92.5 μm. The ratio of the thickness of the support film 30 was 81% relative to the total thickness of the phosphor protection film 100. Similarly, the ratio of the barrier film 10 was 14% and the ratio of the adhesive layer 20 was 5%.

Example 3

A phosphor protection film 100 was produced as in Example 1 except that the barrier film substrate 11, the barrier film 10 and the support film 30 respectively had thicknesses of 12 μm, 12.5 μm and 50 μm. The adhesive layer 20 had a thickness of 5 μm and the phosphor protection film 100 had a thickness (total thickness) of 67.5 μm. The ratio of the thickness of the support film 30 was 74% relative to the total thickness of the phosphor protection film 100. Similarly, the ratio of the barrier film 10 was 19% and the ratio of the adhesive layer 20 was 7%.

Example 4

A barrier film 10 was prepared as described below using a roll-to-roll method. First, silicon oxide was provided as an inorganic film layer 12 by vacuum vapor deposition on one surface of a polyethylene terephthalate (PET) film as a barrier film substrate 11, and a gas barrier covering layer 13 was formed on the inorganic film layer 12. The gas barrier covering layer 13 was formed using a wet coating method by applying a coating liquid containing tetraethoxysilane and polyvinyl alcohol, followed by heating and drying at 180° C. for 40 seconds. Thus, a roll of a barrier film 10 provided with the inorganic film layer 12 and the gas barrier covering layer 13 on one surface of the substrate 11 was obtained. The barrier film 10, the barrier film substrate 11, the inorganic film layer 12 and the gas barrier covering layer 13 respectively had thicknesses of 23.5 μm, 23 μm, 30 nm and 0.5 μm.

A PET film having a thickness of 75 μm was used as a support film substrate 31. The barrier film 10 was fed from the roll using the laminating device shown in FIG. 2, and an adhesive was applied onto the gas barrier covering layer 13 to form an adhesive layer 20 which was then heated and dried at 90° C. for 30 seconds. Then, the support film substrate 31 was laid over the adhesive layer 20 and the resultant laminate was pressed between the nip rolls d, d at a laminating pressure of 0.5 MPa. The laminate was pressed in a state in which wrinkles of the barrier film 10 were smoothed out by applying tension in MD. After that, a mat layer forming-composition was applied onto the support film substrate 31 and the coating was cured by heating and drying at 80° C. for 30 seconds, thereby forming a functional layer (mat layer) 32 having a thickness of 3 μm. The mat layer forming-composition in this case was comprised of 100 parts by mass of an acrylic polyol resin (trade name: ACRYDIC A-814 manufactured by DIC), 8.5 parts by mass of an isocyanate curing agent (trade name: BURNOCK DN-980, a hexamethylene diisocyanate compound, manufactured by DIC), 10 parts by mass of microparticles (polyurethane having an average particle size of 2 μm) and 70 parts by mass of a solvent (ethyl acetate). The functional layer 32 is a layer having an anti-interference fringe function, a light diffusion function and an anti-scratch function.

Through these processes, a phosphor protection film 110 was produced. The phosphor protection film 110 had a laminate in which the barrier film 10, the adhesive layer 20, and the support film 30 formed of the support film substrate 31 and the functional layer 32 were laminated in this order. The adhesive layer 20 had a thickness of 5 µm.

Example 5

A phosphor protection film 110 was produced as in Example 4 except that the barrier film substrate 11 and the barrier film 10 respectively had thicknesses of 12 µm and 12.5 µm.

Example 6

A phosphor protection film 110 was produced as in Example 5 except that the coating liquid used when forming the gas barrier covering layer 13 of the barrier film 10 was heated and dried at 210° C. for 40 seconds.

Comparative Example 1

A phosphor protection film 110 was produced as in Example 4 except that the support film substrate 31 had a thickness of 25 µm.

In the formula, ΔL indicates the heat shrinkage (%) in TD after heating at 150° C. for 30 minutes, $T_b$ indicates the thickness (µm) of a barrier film, and T indicates the total thickness (µm) of a phosphor protection film.

Evaluations of Degree of Wrinkling

The phosphor protection films 100 obtained in Examples 1 to 6 and Comparative Example 1 were visually observed in terms of the presence/absence of wrinkles and the degree of wrinkling. The degree of wrinkling was evaluated based on the following evaluation criteria. The results are shown in Table 1. FIG. 5 shows photographs indicating the degree of wrinkling corresponding to the following evaluation criteria. Specifically, FIG. 5 shows photographs indicating the degree of wrinkling on the surfaces of the phosphor protection films obtained in Examples 5 and 6, and Comparative Example 1.

A: No wrinkles were observed.

B: Only a few shallow and small wrinkles were observed but the degree of wrinkling was practically acceptable.

C: Many deep and large wrinkles were observed.

TABLE 1

|  | Ex. 1 | Ex. 2 | Ex. 3 | Ex. 4 | Ex. 5 | Ex. 6 | Comp. Ex. 1 |
|---|---|---|---|---|---|---|---|
| Thickness of barrier film (µm) | 23.5 | 12.5 | 12.5 | 23.5 | 12.5 | 12.5 | 23.5 |
| Thickness of support film (µm) | 75 | 75 | 50 | 78 | 78 | 78 | 28 |
| Total thickness of phosphor protection film (µm) | 103.5 | 92.5 | 67.5 | 106.5 | 95.5 | 95.5 | 56.5 |
| Thickness ratio of support film | 72 | 81 | 74 | 73 | 82 | 82 | 50 |
| Heating temperature when forming barrier film (° C.) | 180 | 180 | 180 | 180 | 180 | 210 | 180 |
| Wrinkle coefficient α | −0.27 | −0.31 | −0.34 | −0.25 | −0.30 | −0.11 | −0.16 |
| (Degree of wrinkling) | A | A | A | A | A | B | C |

Measurement of Wrinkle Coefficient α

The phosphor protection films 100 obtained in Examples 1 to 6 and Comparative Example 1 were each cut to a size of 100 mm in MD and 100 mm in TD for use as test samples. These samples were each left to stand on a metal plate with the barrier film side down, in a state of applying no tension thereto, followed by heating at 15° C. for 30 minutes in an oven. ΔL was calculated from the following Formula (2), based on the thickness in TD of each test sample before and after heating.

$$\Delta L = \{(\text{Length in } TD \text{ before heating} - \text{Length in } TD \text{ after heating})/\text{Length in } TD \text{ before heating}\} \times 100 \quad (2)$$

Using the calculated ΔL, a wrinkle coefficient α was calculated from the following Formula (1). The results are shown in Table 1.

$$\alpha = \Delta L / \{(T_b \times 100)/T\} \quad (1)$$

REFERENCE SIGNS LIST

100, 110 . . . Phosphor protection film; 10 . . . Barrier film; 11 . . . Barrier film substrate; 12 . . . Inorganic film layer; 13 . . . Gas barrier covering layer; 20 . . . Adhesive layer; 30 . . . Support film; 31 . . . Support film substrate; 32 . . . Functional layer; A . . . Wavelength conversion sheet; 200 . . . Phosphor Layer; 201 . . . Phosphor; 202 . . . Sealing resin; B . . . Light-emitting unit; 300 . . . Light guide plate; 400 . . . Reflective plate; 500 . . . Light source.

What is claimed is:

1. A phosphor protection film, comprising:
   two films that are bonded to each other via an adhesive layer,
   one of the two films being a film including an inorganic film layer, wherein
   when the film including the inorganic film layer of the two films is referred to as a barrier film and the other film of the two films is referred to as a support film, the support film has a thickness occupying 72% or more of a total thickness of the phosphor protection film, and wherein a wrinkle coefficient α of the phosphor protection film is more negative than −0.2, the wrinkle coefficient α being defined by the following Formula (1):

$$\alpha = \Delta L / \{(T_b \times 100)/T\} \qquad (1)$$

where ΔL indicates a heat shrinkage (%) in TD after heating at 150° C. for 30 minutes, $T_b$ indicates a thickness (μm) of a barrier film, and T indicates a total thickness (μm) of the phosphor protection film.

2. The phosphor protection film of claim 1, wherein the barrier film has a thickness occupying 23% or less of the total thickness of the phosphor protection film.

3. The phosphor protection film of claim 1, wherein the barrier film includes a barrier film substrate having a thickness in a range of 9 μm to 25 μm.

4. The phosphor protection film of claim 3, wherein the barrier film is provided with the inorganic film layer and a gas barrier covering layer on the barrier film substrate.

5. The phosphor protection film of claim 1, wherein the support film is provided with a functional layer on a surface facing away from the adhesive layer, the functional layer exerting at least one function selected from a group consisting of an anti-interference fringe function, an anti-reflection function, a light diffusion function, an antistatic function and an anti-scratch function.

6. A wavelength conversion sheet comprising two phosphor protection films of claim 1, and a phosphor layer sandwiched between the two phosphor protection films, wherein the two phosphor protection films both include the support films that are located closer to respective external surfaces of the wavelength conversion sheet than the barrier films are.

7. A light-emitting unit comprising the wavelength conversion sheet of claim 6, a light source and a light guide plate, wherein the wavelength conversion sheet, the light source and the light guide plate are disposed such that light emitted from the light source passes through the light guide plate and is incident on one surface of the wavelength conversion sheet.

* * * * *